United States Patent [19]
Hayashi et al.
[11] 3,843,937
[45] Oct. 22, 1974

[54] SOLID STATE OSCILLATOR

[75] Inventors: Hiromu Hayashi, Kawasaki; Takaya Fujita, Tokyo; Naoto Tanabe, Yokohama, all of Japan
[73] Assignee: Fujitsu Limited, Kawasaki, Japan

[22] Filed: Dec. 26, 1972
[21] Appl. No.: 318,628

[30] Foreign Application Priority Data
Dec. 28, 1971 Japan .................................. 46-3296

[52] U.S. Cl. ................ 331/101, 331/96, 331/107 R
[51] Int. Cl. ............................................ H03b 7/14
[58] Field of Search....... 331/96, 107 R, 107 G, 101

[56] References Cited
UNITED STATES PATENTS
3,414,841 12/1968 Copeland ............................ 331/96
OTHER PUBLICATIONS
Electronic Letters, 29 July, 1971, Vol. 7, No. 15, pp. 433–436.

*Primary Examiner*—John Kominski
*Attorney, Agent, or Firm*—Staas, Halsey & Gable

[57] ABSTRACT
A solid state oscillator in which a coaxial side arm is attached to a waveguide at an appropriate position in a manner to intersect it at right angles thereto; A Gunn diode, Impatt diode or like solid state oscillation device is provided at the intersecting portion, the solid state oscillation device having connected thereto the tip of an inner conductor of the coaxial side arm. The space in the waveguide in the neighborhood of the place where the solid state oscillation device is disposed is made narrower than that of the other waveguide portion by raising the waveguide wall or projecting an outer conductor of the coaxial side arm into the waveguide. With this construction, the real and imaginary parts R and $jX$ of the load impedance at the position of the solid state oscillation device can be separated from each other. This enables easy matching of the solid state oscillation device and the load, so that the maximum output power can be obtained at a desired frequency. Further, it is also possible to suppress spurious oscillation of the solid state oscillation device and simplify the overall circuit construction.

6 Claims, 6 Drawing Figures

SOLID STATE OSCILLATOR

BACKGROUND OF THE INVENTION

1. Field of the Invention

This invention relates to a solid state oscillator employing a solid state oscillation device such as a Gunn diode, an Impatt diode or the like, and more particularly to a solid state oscillator of such a construction that a waveguide and a coaxial line are provided to intersect at right angles and a solid state oscillation device is disposed at the intersecting portion.

2. Description of the Prior Art

The Gunn diode and the Impatt diode are very low in impedance, extremely high in nonlinearity and great in frequency characteristic fluctuation. Further, the Impatt diode exhibits negative resistance over a wide frequency range, and hence often causes spurious oscillation in relation to the circuit, which must be eliminated.

In view of the foregoing, it is necessary that matching of the solid state oscillation device and the load can be achieved at will. This can be made possible, if the real and imaginary parts R and $jX$ of the load impedance could be separated from each other. Then, the maximum output power can be derived at a desired frequency and an oscillator can be designed with a high degree of freedom.

Up to now, however, no satisfactory oscillator which is simple in circuit construction, yet capable of deriving the maximum output power at a desired frequency and free from spurious oscillation has been realized because of mechanical limitations in the ultra-high frequency band, especially in the millimeter wave band.

FIG. 1 shows the construction of a waveguide type oscillator heretofore employed.

In this conventional oscillator, a coaxial line 3 is attached to a reduced height waveguide 1 in a manner to intersect it at right angles, a diode 4 is disposed at the intersecting portion, a coaxial inner conductor, that is, a bias supply post 3*a* is provided and the oscillation frequency is controlled by a variable waveguide short-circuiting plunger (short piston) 2. An equivalent circuit for the waveguide circuit with the coaxial side arm cannot be easily illustrated and its analysis is also very difficult. Accordingly, appropriate dimensions are experimentally determined. The load impedance of this circuit at the position of the diode 4 is such that its real part R varies greatly and that the point $jX=0$ exists at several frequencies. Consequently, its frequency characteristic in the case of moving only the variable waveguide short-circuiting plunger 2 is such as shown in FIG. 2, in which the output power P remarkedly fluctuates and spurious oscillation is likely to occur.

Thus, the real and imaginary parts R and $jX$ cannot be separated from each other, in such a conventional oscillator as depicted in FIG. 1, so that it is difficult to obtain the maximum output power at a desired frequency.

To avoid this difficulty, in the prior art the dimensions are experimentally determined for each frequency be inserting an adjusting screw in the output side or reducing the waveguide height at the position where the diode is mounted. In some cases, an absorber is employed for suppressing spurious oscillation. However, the use of such means introduces complexity in the construction of the oscillator and adjustment therefor is troublesome and, further, a prominent effect cannot be expected.

SUMMARY OF THE INVENTION

The present invention has for its object to provide a solid state oscillator of simple circuit construction which is free from the aforesaid defects experienced in the prior art, which is adapted so that the real and imaginary parts R and $jX$ of the load impedance at the place where the diode is mounted are separated from each other, to provide the maximum output at a desired frequency and which is designed to be difficult to generate spurious oscillation.

This invention is characterized by a waveguide having provided therein a variable short-circuiting plunger, a coaxial side arm attached to the waveguide at right angles thereto, a solid state oscillation device disposed at the intersecting portion of the waveguide and the coaxial line, and wherein the waveguide portion, having positioned therein the solid state oscillation device, while of the same exterior dimension as the remainder of the waveguide, is effectively; and formed lower in height than the remainder of the waveguide, by means which project into the waveguide thereby to produce the effective reduction in height. In such a wavelength, the oscillation frequency and the maximum output power can be respectively determined by the of an inner conductor of the coaxial side arm; length and the variable short-circuiting plunger separately of each other. Accordingly, in the present invention matching of the solid state oscillation device such as a Gunn diode or Impatt diode and the load can be achieved with great ease.

In one disclosed embodiment of this invention, a waveguide includes a projecting portion projecting into the waveguide and having mounted thereon a solid state oscillation device. With the provision of this projection, the real and imaginary parts R and $jX$ of the load impedance at the position of the solid state oscillation element can be separated from each other and the range in which the real part R is variable can be controlled by appropriate selection of the shape of the projection having mounted thereon the solid state.

In further embodiment of this invention, an outer conductor of a coaxial side arm attached to a waveguide at right angles thereto and extended into the waveguide. Further a solid state oscillation device is provided on the wall of the waveguide opposite to the wall thereof through which the outer conductor extends. Also with this arrangement, the real and imaginary parts R and $jX$ of the load impedance at the position of the solid state oscillation device can be separated from each other and the solid state oscillator can easily be produced.

BRIEF DESCRIPTION OF THE DRAWINGS

While the specification concludes with claims particularly pointing out and distinctly claiming the subject matter which is regarded as the invention, preferred embodiments are disclosed in the following detailed description taken in conjunction with the accompanying drawings, in which:

DESCRIPTION OF THE PREFERRED EMBODIMENTS

Figure 1:
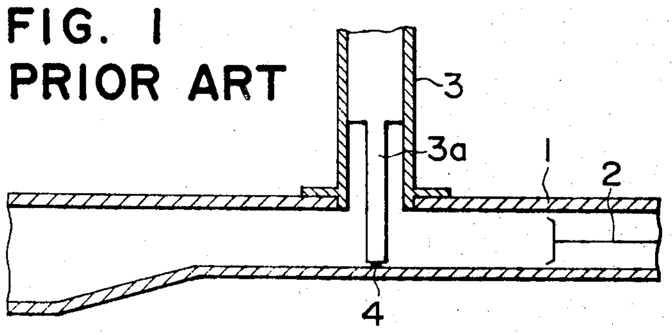
FIG. 1 PRIOR ART
FIG. 1 is a cross section, for explaining a conventional solid state oscillator.
Figure 2:
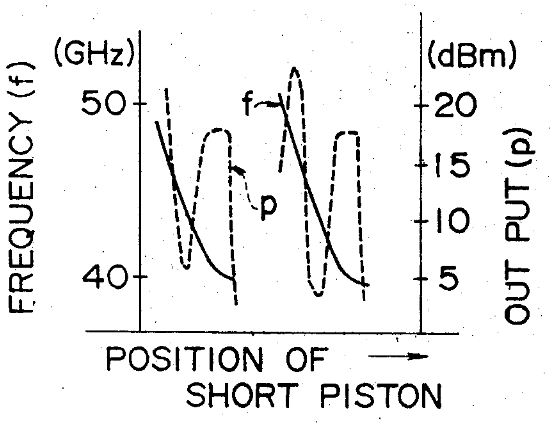
FIG. 2 PRIOR ART
FIG. 2 is a graph showing the oscillation characteristic of the solid state oscillator depicted in FIG. 1.
Figure 3:
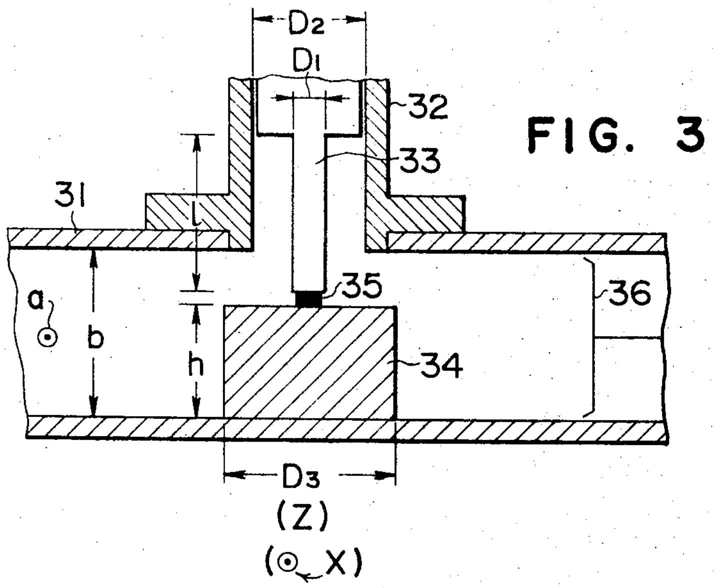
FIGS. 3 and 4 are cross sections, for explaining examples of this invention.

In FIG. 3, reference numeral 31 indicates a waveguide, 32 a coaxial side arm provided perpendicularly to the waveguide 31, 33 an inner conductor of the coaxial side arm 32, 34 a waveguide projection, 35 a diode or like solid state oscillation device mounted on the waveguide projection 34 and connected with the inner conductor 33, and 36 a variable waveguide short-circuiting plunger.

In the embodiment of FIG. 3, the space within the waveguide 31 in the vicinity of the solid state oscillation device 35 is narrower than that of the remaining portion because the waveguide projection 34 is provided.

Figure 4:
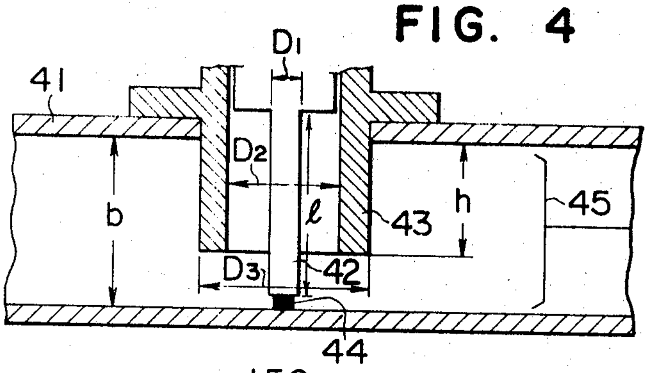

In FIG. 4, reference numeral 41 designates a waveguide, 42 an inner conductor of a coaxial side arm, 43 an extended outer conductor, 44 a solid state oscillation device, and 45 a variable waveguide plunger.

In the embodiment of FIG. 4, the space within the waveguide 41 in the neighborhood of the solid state oscillation element 44 is narrower than that of the remaining portion because the outer conductor 43 is extended into the waveguide 41.

With the reduction of the space in the waveguide 31 or 41 in the vicinity of the solid state oscillation device 35 or 44 as compared with the remaining portion of the waveguide, the real and imaginary parts R and $jX$ of the impedance can be separated from each other.

Then, it is possible to generate the maximum output power by determining i.e., selectively varying the real part R of the impedance by the adjustment of the variable waveguide short-circuiting plunger 36 or 45 and set an oscillation frequency by determining i.e., selectively establishing the imaginary part $jX$ of the impedance based on the length of the inner conductor 33 or 42.

In practice, the dimensions of a solid state oscillator, in which the oscillation device oscillates in the range of the imaginary part $jX=j(0\sim \pm 30)$ ($\Omega$), and the real part $R=0\sim30(\Omega)$ while including parasitic capacitance and inductance of a package, leads and so on, can be obtained as follows:

Namely, in the construction of FIG. 3, if the diameter of the outer conductor 32 is taken as $D_2$ and the outer diameter of the inner conductor 33 is taken as $D_1$ are taken $a$ and $b$ (where the width dimension $a$ is perpendicular to the height dimension $b$ as illustrated in FIG. 3 and thus perpendicular to the plane of the page), and if the outer diameter and height of the waveguide projection 34 (assumed to be columnar, i.e., cylindrical) for mounting thereon the solid state oscillation device 35 are taken as $D_3$ and $h$, respectively the best results can be obtained by selecting the respective dimensions to satisfy the following conditions:

$$D_1 + D_2<(2a/\pi),\ (b/2) <h<\tfrac{3}{4}b'',$$

$$\tfrac{3}{4}D_2<D_3<a$$

Figures 5A, 5B:
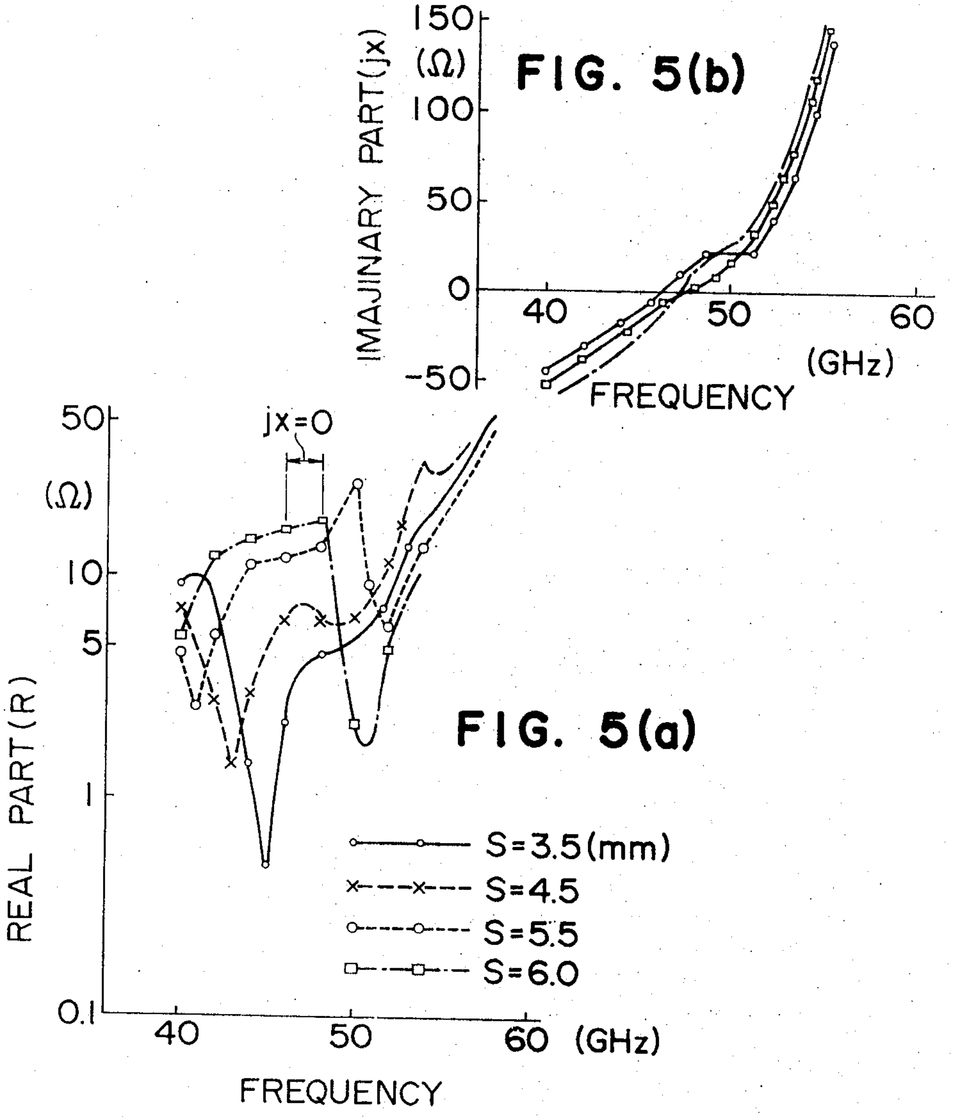
FIGS. 5a and b show the load impedance characteristic of the solid state oscillator of this invention, FIGS. 5a and 5b being graphs showing characteristics in the real and imaginary parts respectively.

FIGS. 5a and b shows measured results of the impedance of the above oscillator in the millimeter wave band. The illustrative dimensions of the oscillator used are such as $a$=4.775mm, $b$=2.388mm, $D_1$=0.3mm, $D_2$=2mm, $h$=1.5mm, $D_3$=3mm and $l$=3.5mm. The measured values of load the impedance at the position of the diode are shown by curves. FIG. 5a shows the real part load impedance and FIG. 5b the imaginary part impedance.

As will be apparent from FIGS. 5a and 5b, for example, the real part R can be altered from zero to 20 $\Omega$ by moving the variable short-circuiting plunger at a frequency of about 47GHz where the imaginary part $jX$ equals zero. In FIG. 5a, the distance from the diode of the variable short-plunger is indicated by S. By changing the length $L$ of the inner conductor, the frequency can be altered at will and no spurious frequency is produced.

The foregoing description has been given in connection with the case where the waveguide projection 34 is columnar (i.e., cylindrical), but the waveguide projection 34 need not always be columnar (i.e., cylindrical) but may be of a square or rectangular cross section or the like. In such a case where the waveguide projection 34 has the length Z in the signal advance direction (i.e., the direction in FIG. 3 corresponding to dimension $D_3$, and thus where the length Z for a square or rectangular cross section projection is substituted for the dimension $D_3$ of a cylindrical projection) and the width X (the width X thus being perpendicular to the length Z and extending perpendicularly to the plane of the illustration of FIG. 3), performance is maximized by selecting the waveguide dimensions to satisfy the following conditions:

$$\tfrac{3}{4}D_2<Z<a;\quad b/2<h<\tfrac{3}{4}b;$$

$$\tfrac{3}{4}D_2<X<a;$$

By forming the upper part of the waveguide projection 34 to be convex or tapered, the variable range of the real part R can be controlled. Further, fine frequency control is possible with the use of an adjusting screw in the coaxial side arm of the oscillator. The load impedance can be controlled at will by the short-circuiting plunger, so that this oscillator can also be used as a solid state amplifier.

With such a construction of this invention as described in the foregoing, it is possible to set the oscillation frequency and the maximum output by selecting and/or adjusting the length of the inner conductor of the coaxial side member and the position of the variably positioned short-circuiting plunger, respectively separately of each other and spurious oscillation can also be prevented.

What is claimed is:

1. A solid state oscillator comprising:

a waveguide having first and second pairs of opposite walls, a coaxial side arm attached at right angles to one of the side walls of one said pair thereof and defining a corresponding, intersecting portion of the waveguide, means projecting from one of said side walls of said given pair toward the other side wall in the said intersecting portion of the waveguide for reducing the effective dimensions of said waveguide in said intersecting portion thereof, said coaxial side arm having an inner conductor extending at its free end into said reduced dimension, intersecting portion of the waveguide, a solid state oscillation device mounted on the said free end of said inner conductor, and a short-circuiting plunger mounted for selective, variable positioning within said waveguide adjacent said intersecting portion thereof, the length of said inner conductor being selected in accordance with a desired oscillation frequency of said solid state oscillator and the position of said plunger being selected to determine independently of the said oscillation frequency, the output power level of said oscillator.

2. A solid state oscillator as recited in claim 1 wherein said projecting means comprises an element mounted on the side wall of said given pair opposite the side wall to which said coaxial side arm is connected, and said solid state oscillation device is disposed on said projection.

3. A solid state oscillator as recited in claim 2 wherein said waveguide has the dimension *b* between the said opposed side walls of said given pair and the dimension *a* between the opposed side walls of the other said pair, said coaxial side arm includes said inner conductor and an outer conductor, said inner conductor having an outside diameter $D_1$ and said outer conductor having an inner diameter $D_2$ and wherein:

said projecting means comprises a cylindrical projection having a diameter $D_3$ and an axial direction of *h* and wherein the aforesaid dimensions are selected in accordance with:

$D_1 + D_2 < 2a/\pi$; $b/2 < h < \frac{3}{4}b$; and $\frac{3}{4}D_2 < D_3 < a$.

4. A solid state oscillator as recited in claim 2 wherein said waveguide has the dimension *b* between the said opposed side walls of said given pair and the dimension *a* between the opposed side walls of the other said pair, said coaxial side arm includes said inner conductor and an outer conductor, said inner conductor having an outside diameter $D_1$ and said outer conductor having an inner diameter $D_2$, and wherein:

said projecting means is of a rectangular cross-sectional configuration having a dimension Z in the direction of signal propagation within said waveguide, a transverse dimension X and a height *h*, and wherein said dimensions are selected in accordance with:

$\frac{3}{4} D_2 < Z < a$; $b/2 < h < \frac{3}{4}b$; and $\frac{3}{4}D_2 < X < a$.

5. A solid state oscillator as recited in claim 1 wherein said coaxial side arm includes an outer conductor and wherein:

said projecting means comprises an extension of said outer conductor of the coaxial side arm which extends from the said one of the said walls of said given pair toward the opposed wall of that given pair and wherein, said solid state oscillation device is disposed on said opposed side wall of said given pair.

6. A solid state oscillator as recited in claim 5 wherein said waveguide has the dimension *b* between the said opposed side walls of said given pair and the dimension *a* between the opposed side walls of the other said pair, said coaxial side arm includes said inner conductor and an outer conductor, said inner conductor having an outside diameter $D_1$ and said outer conductor having an inner diameter $D_2$ and wherein:

said outer conductor of said coaxial side arm extends inwardly of the said one of said side walls of said given pair by a dimension *h*, and the dimensions of the spaced side walls include the dimension *b* between the pair of side walls to said one of which said coaxial side arm is attached and wherein the dimensions are selected in accordance with:

$D_1 + D_2 < 2a/\pi$; $b/2 < h < \frac{3}{4}b$; and $\frac{3}{4} D_2 < D_3 < a$.

* * * * *

UNITED STATES PATENT OFFICE
CERTIFICATE OF CORRECTION

Patent No. 3,843,937 Dated October 22, 1974

Inventor(s) Hiromu Hayashi, Takaya Fujita & Naoto Tanabe

It is certified that error appears in the above-identified patent and that said Letters Patent are hereby corrected as shown below:

Column 1, line 62, change "be" to -- by --;

Column 2, line 22, delete ", and"

line 27, after "the" insert -- length -- line 28, after "arm;" delete "length"

Column 3, line 64, at the end of the equation delete " ' "

Column 4, line 14, change "L" to -- $\ell$ --.

Signed and sealed this 7th day of January 1975.

(SEAL)
Attest:

McCOY M. GIBSON JR.
Attesting Officer

C. MARSHALL DANN
Commissioner of Patents